(12) United States Patent
Maruyama et al.

(10) Patent No.: US 6,313,704 B1
(45) Date of Patent: Nov. 6, 2001

(54) MULTI-STAGE SIGNAL AMPLIFYING CIRCUIT

(75) Inventors: Takaya Maruyama; Hisayasu Satoh, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/632,269

(22) Filed: Aug. 3, 2000

(30) Foreign Application Priority Data

Feb. 8, 2000 (JP) .................................................. 12-030931

(51) Int. Cl.$^7$ ................................ H03F 3/45; H03L 5/00
(52) U.S. Cl. ........................ 330/259; 330/310; 327/307
(58) Field of Search ................................... 330/252, 259, 330/310; 327/307

(56) References Cited

U.S. PATENT DOCUMENTS

| | | | |
|---|---|---|---|
| 5,039,952 | * 8/1991 | Dreps et al. ........................... | 330/252 |
| 5,218,320 | * 6/1993 | Albouy et al. ........................ | 330/259 |
| 5,506,537 | * 4/1996 | Kimura ................................. | 327/307 |
| 5,635,880 | * 6/1997 | Brown .................................. | 330/253 |
| 5,838,197 | * 11/1998 | Tsukuda ............................... | 330/259 |

FOREIGN PATENT DOCUMENTS 6-196947    7/1994    (JP) .

* cited by examiner

Primary Examiner—Robert Pascal
Assistant Examiner—Khanh Van Nguyen
(74) Attorney, Agent, or Firm—Burns, Doane, Swecker & Mathis, LLP

(57) ABSTRACT

In cases where a direct-current offset occurs in a differential signal output from a differential signal amplifier when a differential input signal is differentially amplified in a series of differential signal amplifiers, a direct-current offset component amplified is included in a differential signal output from a particular differential signal amplifier. To suppress the direct-current offset component, the differential signal is, at first, differentially amplified in a pair of transistors of a detecting amplifier, the direct-current offset component is extracted in a low-pass filter from the differential signal amplified, and compensating currents produced according to the direct-current offset component are input to a differential signal amplifier preceding to the particular differential signal amplifier to adjust the direct-current offset component of the differential signal to zero. Because the pair of transistors of the detecting amplifier inevitably have a high input impedance, the differential signal can be directly received in the detecting amplifier, so that the low-pass filter can be formed on a minimized layout area without considering its input impedance. Therefore, a multi-stage signal amplifying circuit can be manufactured on a small layout area while preventing a voltage level of the differential signal from exceeding an input dynamic range of the differential signal amplifiers.

4 Claims, 7 Drawing Sheets

MULTI-STAGE SIGNAL AMPLIFYING CIRCUIT

BACKGROUND OF THE INVENTION

1. Field of the Invention

The present invention relates to a multi-stage signal amplifying circuit in which a differential input signal is differentially amplified in a plurality of differential signal amplifiers serially connected with each other in multi-stage to output a differential output signal, and more particularly to a multi-stage signal amplifying circuit manufactured in a small layout area of an integrated circuit while effectively suppressing a direct-current offset occurring in the differential signal amplifiers arranged in the multi-stage.

2. Description of Related Art

FIG. 5 is a circuit diagram showing the configuration of a conventional multi-stage signal amplifying circuit. In FIG. 5, a reference sign 13 indicates each of a plurality of differential signal amplifiers serially connected with each other in multi-stage. A differential input signal (composed of a voltage signal of a voltage Va(in) and a voltage signal of a voltage Vb(in)) is input to the differential signal amplifier 13 arranged in the first stage to be differentially amplified and to output a differential signal, the differential signal is differentially amplified in each of the differential signal amplifiers 13 arranged after the differential signal amplifier 13 of the first stage, and the differential signal amplified in the differential signal amplifier 13 of the final stage is output as a differential output signal (composed of a voltage signal of a voltage Va(out) and a voltage signal of a voltage Vb(out)).

FIG. 6(a) is an input/output characteristic diagram of the differential signal amplifier 13 arranged in the first stage, and FIG. 6(b) is an input/output characteristic diagram of the differential signal amplifier 13 arranged in the final stage. FIG. 6(a) and FIG. 6(b) shows a problem in the conventional multi-stage signal amplifying circuit.

A reference sign 14 is an X axis indicating an input differential voltage (Va(in)–Vb(in) in FIG. 6(a), Va(n–1)–Vb(n–1) in FIG. 6(b)) of the differential input signal (or the differential signal) applied to the differential signal amplifier 13, a reference sign 15 is an Y axis indicating output voltages (Va(1) and Vb(1) in FIG. 6(a), Va(n) and Vb(n) in FIG. 6(b)) of the differential signal or the differential output signal) output from the differential signal amplifier 13, a reference sign 16 indicates a first voltage amplifying characteristic curve (the voltage Va(1) in FIG. 6(a), the voltage Va(n) in FIG. 6(b)) and a second voltage amplifying characteristic curve (the voltage Vb(1) in FIG. 6(a), the voltage Vb(n) in FIG. 6(b)) in the differential signal amplifier 13, a reference sign 17 indicates a time axis, a reference sign 18 indicates two waveforms of input voltages (Va(in) and Vb(in) in FIG. 6(a), or Va(n–1) and Vb(n–1) in FIG. 6(b)) of the differential signal input to the differential signal amplifier 13, a reference sign 19 indicates a time axis, a reference sign 20 indicates two waveforms of output voltages (Va(1) and Vb(1) in FIG. 6(a), or Va(n) and Vb(n) in FIG. 6(b)) of the differential signal output from the differential signal amplifier 13, a reference sign 21 indicates a cross point of the voltage amplifying characteristic curves 16 of the differential signal amplifier 13, and a reference sign 22 indicates a direct-current component difference (called a direct-current offset voltage) between direct-current component values of the output voltage waveforms 20 of the differential signal output from the differential signal amplifier 13.

As shown in FIG. 6(a) and FIG. 6(b), because a plurality of transistors arranged in each differential signal amplifier 13 have characteristics different from each other, even though the differential signal satisfying the input differential voltage of 0 V (Va(in)=Vb(in), or Va(n–1)=Vb(n–1)) is input to the differential signal amplifier 13 of the first stage (or the final stage), there is a case that voltages Va(1) and vb(1) (or voltages Va(n) and Vb(n)) of the differential signal output from the differential signal amplifier 13 of the first stage (or the final stage) do not agree with each other. Therefore, a direct-current offset voltage, of which a value equals to a difference between the output voltages at the input differential voltage of 0 V, is generated between the output voltage waveforms 20 of the differential signal. Also, a region, in which each of the output voltages linearly changes with respect to the input differential voltage, is called a non-saturated region, and a region, in which each of the output voltages does not linearly change with respect to the input differential voltage, is called a saturation region placed outside the non-saturated region. A range of the input differential voltage corresponding to the non-saturated region is called an input dynamic range, and the input differential voltage within the input dynamic range can be used for a signal amplification.

As shown in FIG. 5, in cases where the plurality of differential signal amplifiers 13 are serially connected with each other in the multi-stage, the direct-current component difference between the output voltage waveforms of the differential signal output from the differential signal amplifier 13 of an I-th stage (I=1, 2, - - - ) is amplified with signal components of the differential signal in each differential signal amplifier 13 of an (I+1)-th stage following the I-th stage. Therefore, as shown in FIG. 6(b), the direct-current component difference extraordinarily increased is input to the differential signal amplifier 13 of the final stage. In cases where the direct-current component difference (or the direct-current offset voltage) approaches the input dynamic range of the differential signal amplifier 13, the differential signal input to the differential signal amplifier 13 is amplified in the saturation region. Therefore, there is a problem that the signal component of the differential signal is not substantially amplified.

To avoid this problem, a technique to solve the problem that the direct-current component difference is extraordinarily increased in a plurality of differential signal amplifiers connected with each other in series not to substantially amplify a differential signal is disclosed in the Published Unexamined Japanese Patent Application No. H6-196947 (1994).

FIG. 7 is a circuit diagram showing the configuration of another conventional multi-stage signal amplifying circuit.

In FIG. 7, a reference sign 23 indicates an amplifying unit in which a plurality of differential signal amplifiers are connected with each other in series, a reference sign 24 indicates a low-pass filter composed of a plurality of resistive elements and a plurality of capacitive elements, and a reference sign 25 indicates a direct-current offset compensating circuit. In this conventional multi-stage signal amplifying circuit, a differential signal input to the amplifying unit 23 is amplified, an output of the amplifying unit 23 is filtered in the low-pass filter 24 to extract a direct-current component difference (or a slowly varying component difference) from the output, the direct-current component difference is amplified at a prescribed amplification factor in the direct-current offset compensating circuit 25, and the amplified direct-current component difference is fed back to an input side of the amplifying circuit 23. Therefore, the amplifying circuit 23 is controlled to compensate the direct-current component difference.

Accordingly, the direct-current component difference existing in the output is adjusted to zero, it is prevented that the direct-current component difference approaches the dynamic range of the amplifying circuit 23, so that a signal component of the differential signal can be amplified.

However, because the conventional multi-stage signal amplifying circuit has the configuration shown in FIG. 7, the output of the amplifying circuit 23 is, at first, filtered in the low-pass filter 24, so that it is required that an input impedance of the low-pass filter 24 is heightened. In this case, it is required that values of the resistive elements of the low-pass filter 24 are heightened, so that a size of each resistive element is enlarged. Therefore, there is another problem that a layout area required for the resistive elements of the low-pass filter 24 is considerably increased in cases where the conventional multi-stage signal amplifying circuit is manufactured on a semiconductor substrate.

SUMMARY OF THE INVENTION

An object of the present invention is to provide, with due consideration to the drawbacks of the conventional multi-stage signal amplifying circuit, a multi-stage signal amplifying circuit which is formed on a small layout area of a semiconductor substrate while preventing a direct-current component difference in an output of a first differential signal amplifier from increasing to a voltage level equivalent to an input dynamic range of a second differential signal amplifier arranged after the first differential signal amplifier.

The object is achieved by the provision of a multi-stage signal amplifying circuit in which a plurality of differential signal amplifiers are serially arranged in multi-stage to receive an output of one differential signal amplifier in another differential signal amplifier, to differentially amplifying a differential input signal input to the differential signal amplifier of a first stage and to output a differential output signal from the differential signal amplifier of a final stage, comprising:

a detecting amplifier for receiving a differential amplified signal output from a particular differential signal amplifier placed on a second stage or after the second stage and differentially amplifying the differential amplified signal to output an offset detecting differential signal;

a low-pass filter for passing only a direct-current component of the offset detecting differential signal output from the detecting amplifier; and compensating current generating amplifier for receiving the offset detecting differential signal passing through the low-pass filter, producing an offset compensation differential signal according to the offset detecting differential signal and inputting the offset compensation differential signal to a specific differential signal amplifier preceding to the particular differential signal amplifier.

In the above configuration, in cases where a direct-current offset occurs in a differential amplified signal output from a differential signal amplifier of a stage preceding to the stage of the specific differential signal amplifier, a direct-current offset component, which is caused by the direct-current offset and is amplified in one or more differential signal amplifiers, is included in the differential amplified signal output from the particular differential signal amplifier. The differential amplified signal including the direct-current offset component is amplified in the detecting amplifier to detect the direct-current offset component, only the direct-current offset component of the differential amplified signal passes through the low-pass filter, and the direct-current offset component is received in the compensating current generating amplifier as an offset detecting differential signal.

In the compensating current generating amplifier, an offset compensation differential signal is produced according to the direct-current offset component and is input to the specific differential signal amplifier to compensate the direct-current offset component of the differential amplified signal output from the specific differential signal amplifier, so that the direct-current offset component included in the differential amplified signal output from the particular differential signal amplifier is made zero.

Accordingly, the amplification of the differential amplified signal having the direct-current offset component in the specific differential signal amplifier is controlled according to the offset compensation differential signal to adjust the direct-current offset component of the differential amplified signal output from the particular differential signal amplifier to zero, so that the direct-current offset occurring in the differential amplified signal output from the differential signal amplifier preceding to the specific differential signal amplifier can be suppressed.

Also, because an input impedance of the detecting amplifier is inevitably high, the differential amplified signal output from the particular differential signal amplifier can be directly input to the detecting amplifier. Because the differential amplified signal is not directly input to the low-pass filter, even though resistive elements and capacitive elements are used for the low-pass filter, it is not required to consider an input impedance of the low-pass filter when values of the resistive elements and the capacitive elements are determined. Therefore, sizes of the resistive elements and the capacitive elements can be made small, so that the multi-stage signal amplifying circuit manufactured in a layout area smaller than that of the conventional multi-stage signal amplifying circuit can be obtained.

It is preferred that the detecting amplifier comprises a pair of npn transistors of which emitters are connected with each other, a constant current source arranged between the group of emitters of the npn transistors and a low-voltage source, a resistive element arranged between the emitter of one npn transistor and a high-voltage power source, and another resistive element arranged between the emitter of the other npn transistor and the high-voltage power source, and the low-pass filter comprises the pair of resistive elements, a capacitive element arranged in parallel to one resistive element, and another capacitive element arranged in parallel to the other resistive element.

In the above configuration, the detecting amplifier and the low-pass filter use the pair of resistive elements in common. Therefore, the layout area occupied by the multi-stage signal amplifying circuit can be moreover made small.

It is also preferred that the detecting amplifier comprises a pair of pnp transistors of which emitters are connected with each other, a constant current source arranged between the group of emitters of the pnp transistors and a high-voltage power source, a resistive element arranged between the emitter of one pnp transistor and a low-voltage source, and another resistive element arranged between the emitter of the other pnp transistor and the low-voltage source, and the low-pass filter comprises the pair of resistive elements, a capacitive element arranged in parallel to one resistive element, and another capacitive element arranged in parallel to the other resistive element.

In the above configuration, the detecting amplifier and the low-pass filter use the pair of resistive elements in common.

Therefore, the layout area occupied by the multi-stage signal amplifying circuit can be moreover made small.

Also, because frequency characteristics of a pnp transistor formed on a semiconductor substrate are generally inferior to those of an npn transistor formed on the semiconductor substrate (for example, a high-frequency follow-up characteristic in the pnp transistor is low), a function of a low-pass filter can be obtained in the pair of pnp transistors of the detecting amplifier. Therefore, the low-pass filter comprising the resistive elements and the capacitive elements can be formed in a smaller layout area.

The object is also achieved by the provision of a multi-stage signal amplifying circuit in which a plurality of differential signal amplifiers are serially arranged in multi-stage to receive an output of one differential signal amplifier in another differential signal amplifier, to differentially amplifying a differential input signal input to the differential signal amplifier of a first stage and to output a differential output signal from the differential signal amplifier of a final stage, comprising:

a detecting amplifier, in which a first pair of transistors, a second pair of transistors, a resistive element connected with both a collector of a first transistor of the first pair of transistors and a collector of a first transistor of the second pair of transistors, a resistive element connected with both a collector of a second transistor of the first pair of transistors and a collector of a second transistor of the second pair of transistors, a resistive element connected with an emitter of one transistor for each of the four transistors, a constant current source arranged between the group of resistive elements connected with the emitters of the first pair of transistors and a high-voltage power source or a low-voltage source and a constant current source arranged between the group of resistive elements connected with the emitters of the second pair of transistors and the high-voltage power source or the low-voltage source are arranged and bases of the second transistors of the pairs of transistors are connected with another low-voltage source or another high-voltage power source, for receiving a differential amplified signal output from a particular differential signal amplifier placed on a second stage or after the second stage at bases of the first transistors of the pairs of transistors and differentially amplifying the differential amplified signal to output an offset detecting differential signal; and a compensating current generating amplifier for receiving the offset detecting differential signal output from the detecting amplifier, producing an offset compensation differential signal according to the offset detecting differential signal and inputting the offset compensation differential signal to a specific differential signal amplifier preceding to the particular differential signal amplifier.

In the above configuration, in cases where a direct-current offset occurs in a differential amplified signal output from a differential signal amplifier of a stage preceding to the stage of the specific differential signal amplifier, a direct-current offset component, which is caused by the direct-current offset and is amplified in one or more differential signal amplifiers, is included in the differential amplified signal output from the particular differential signal amplifier. Therefore, the differential amplified signal is composed of an alternating-current component indicating a signal component and the direct-current offset component.

When the differential amplified signal is input to the first transistors of the detecting amplifier, though an electric current depending on the alternating-current component flows through each transistor, because the electric currents flowing through the first transistors pass through the resistive element connected with the collectors of the first transistors, the alternating-current component is cancelled out in one voltage signal of the offset detecting differential signal obtained by differentially amplifying the differential amplified signal in the first transistors. Also, because the electric currents flowing through the second transistors pass through the resistive element connected with the collectors of the second transistors, the alternating-current component is cancelled out in the other voltage signal of the offset detecting differential signal obtained by differentially amplifying the differential amplified signal in the second transistors.

Therefore, the offset detecting differential signal indicating only the direct-current offset component of the differential amplified signal is received in the compensating current generating amplifier.

In the compensating current generating amplifier, an offset compensation differential signal is produced according to the direct-current offset component and is input to the specific differential signal amplifier to compensate the direct-current offset component of the differential amplified signal output from the specific differential signal amplifier, so that the direct-current offset component included in the differential amplified signal output from the particular differential signal amplifier is made zero.

Accordingly, the amplification of the differential amplified signal having the direct-current offset component in the specific differential signal amplifier is controlled according to the offset compensation differential signal to adjust the direct-current offset component of the differential amplified signal output from the particular differential signal amplifier to zero, so that the direct-current offset occurring in the differential amplified signal output from the differential signal amplifier preceding to the specific differential signal amplifier can be suppressed.

Also, because an input impedance of the detecting amplifier is inevitably high, the differential amplified signal output from the particular differential signal amplifier can be directly input to the detecting amplifier. Also, because the direct-current component is extracted from the differential amplified signal in the detecting amplifier by canceling out the alternating-current component of the differential amplified signal in the pairs of transistors, no low-pass filter is required. Therefore, no layout area is occupied by the low-pass filter, so that the multi-stage signal amplifying circuit manufactured in a layout area smaller than that of the conventional multi-stage signal amplifying circuit can be obtained.

BRIEF DESCRIPTION OF THE DRAWINGS

FIG. 6(*b*) is an input/output characteristic diagram of a differential signal amplifier of the final stage arranged in the conventional multi-stage signal amplifying circuit shown in FIG. 5.

DETAILED DESCRIPTION OF THE PREFERRED EMBODIMENTS

The invention will now be described with reference to the accompanying drawings.

Embodiment 1

Figure 1:
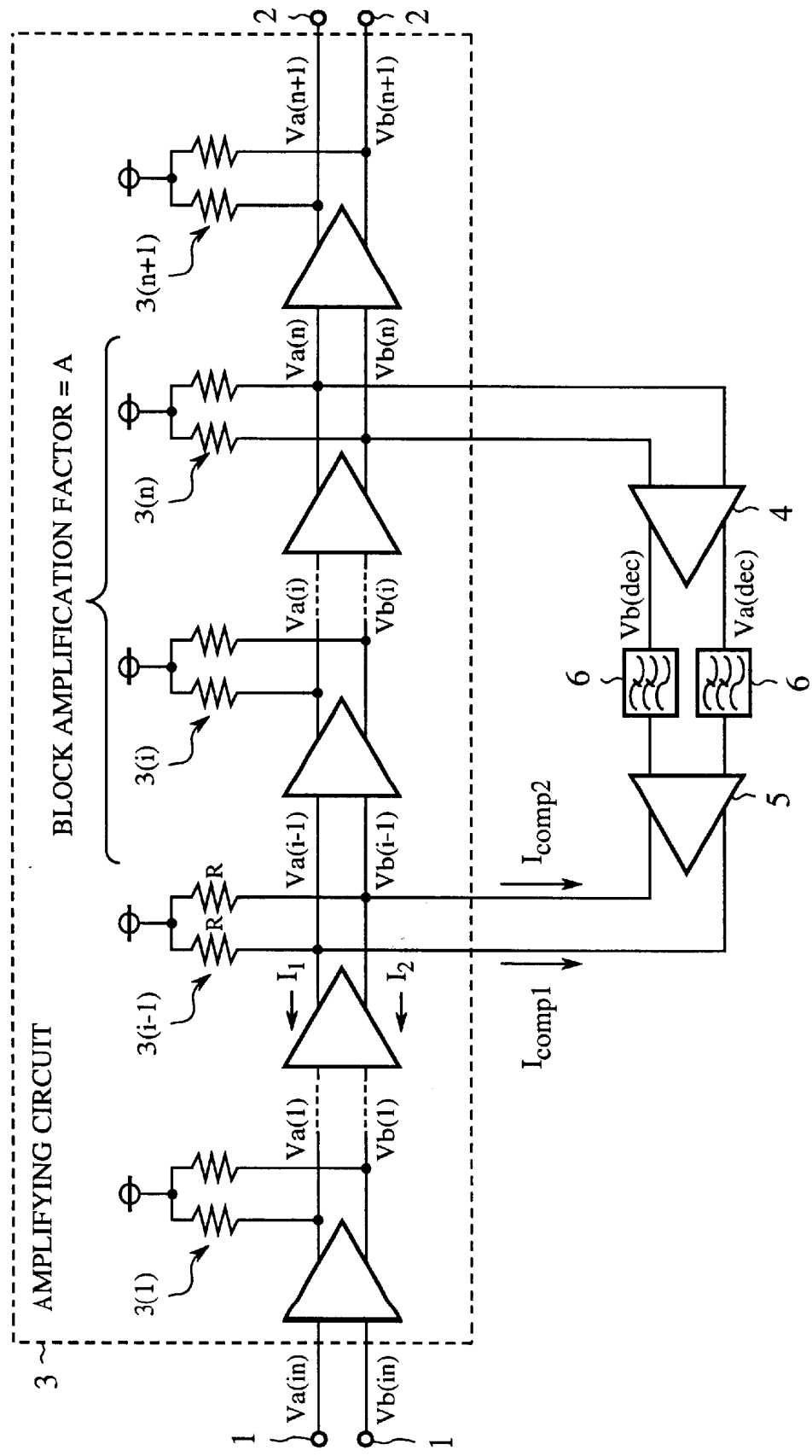
FIG. 1 is a circuit diagram showing the configuration of a multi-stage signal amplifying circuit according to embodiments of the present invention.

FIG. 1 is a circuit diagram showing the configuration of a multi-stage signal amplifying circuit according to embodiments of the present invention.

In FIG. 1, a reference sign 1 indicates a pair of input terminals to which a differential input signal sent to a multi-stage signal amplifying circuit is input, a reference sign 2 indicates a pair of output terminals from which a differential output signal of the multi-stage signal amplifying circuit is output, and a reference sign 3 indicates an amplifying circuit, in which (n+1) differential signal amplifiers 3(1), - - - , 3(i), - - - , 3(n) and 3(n+1) are serially connected with each other in multi-stage. The differential input signal input to the pair of input terminals 1 is differentially amplified in the differential signal amplifier 3(1) of the first stage to output a differential amplified signal, the differential amplified signal is differentially amplified in the differential signal amplifiers 3(2) to 3(n+1) while the differential amplified signal output from one differential signal amplifier 3(J) of an J-th stage ($1 \leq J \leq n$) is input to another differential signal amplifier 3(J+1) of an (J+1)-th stage following the differential signal amplifier of the J-th stage, and the differential amplified signal is output from the differential signal amplifier 3(n+1) of the final stage as the differential output signal.

A reference sign 4 indicates a detecting amplifier for differentially amplifying the differential amplified signal output from a particular differential signal amplifier 3(n) of the n-th stage to output an offset detecting differential signal. A reference sign 5 indicates a compensating current generating amplifier for receiving the offset detecting differential signal from the detecting amplifier 4 and outputting an offset compensation differential signal, which is determined by receiving a pair of offset compensating currents Icomp1 and Icomp2 from the differential signal amplifier 3(i−1) of the (i−1)-th stage according to the offset detecting differential signal, to a specific differential signal amplifier 3(i−1) of the (i−1)-th stage ((i−1)<n is satisfied). A reference sign 6 indicates a pair of low-pass filters, which are arranged on a signal path of the offset detecting differential signal placed between the detecting amplifier 4 and the compensating current generating amplifier 5, for passing a direct-current component (including a slowly varying component) of the offset detecting differential signal.

Also, a reference sign Va(in) denotes a voltage of one voltage signal of the differential input signal input from one input terminal 1 to the differential signal amplifier 3(1) of the first stage, a reference sign Vb(in) denotes a voltage of the other voltage signal of the differential input signal input from the other input terminal 1 to the differential signal amplifier 3(1) of the first stage, a reference sign Va(x) denotes a voltage of one voltage signal of the differential amplified signal output from the differential signal amplifier 3(x) of the x-th stage ($1 \leq x \leq n+1$), a reference sign Vb(x) denotes a voltage of the other voltage signal of the differential amplified signal output from the differential signal amplifier 3(x) of the x-th stage, a reference sign Va(dec) denotes a voltage of one detecting signal of the offset detecting differential signal output from the detecting amplifier 4, and a reference sign Vb(dec) denotes a voltage of the other detecting signal of the offset detecting differential signal output from the detecting amplifier 4.

In the present invention, it is applicable that the detecting amplifier 4 receive a differential amplified signal output from a particular differential signal amplifier placed on a second stage or after the second stage to differentially amplify the differential amplified signal. Also, it is applicable that the compensating current generating amplifier 5 send the offset compensation differential signal to a specific differential signal amplifier preceding to the particular differential signal amplifier.

Figure 2:
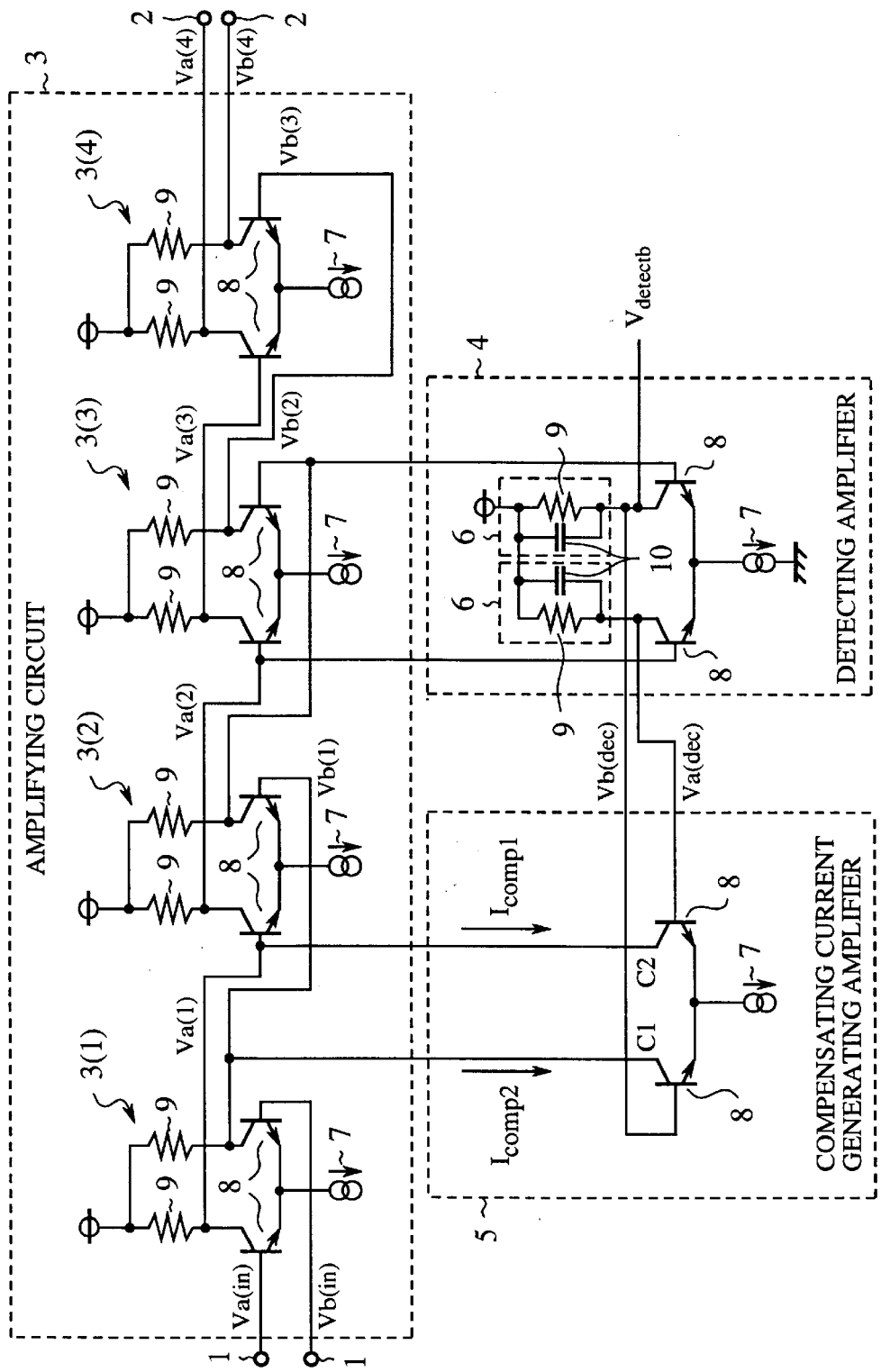
FIG. 2 is a circuit diagram showing a configuration example (at three stages) of the multi-stage signal amplifying circuit shown in FIG. 1 according to a first embodiment.

FIG. 2 is a circuit diagram showing a configuration example (n=3) of the multi-stage signal amplifying circuit shown in FIG. 1 according to a first embodiment.

In FIG. 2, each reference sign 7 indicates a constant current source, each reference sign 8 indicates a negative-positive-negative (npn) transistor, each reference sign 9 indicates a resistive element, and each reference sign 10 indicates a capacitive element.

In each differential signal amplifier 3(x) of the multi-stage signal amplifying circuit, emitters of the pair of npn transistors 8 are directly connected with each other, one constant current source 7 is arranged between a connection line of the emitters and a low-voltage source (not shown), and one resistive element 9 is arranged between the collector of each npn transistor 8 and a high-voltage power source. Therefore, each differential signal amplifier 3(x) has a so-called differential amplification structure.

When a voltage signal of the differential amplified signal (or the differential input signal) is input to the base of each npn transistor 8 of one differential signal amplifier 3(x), an electric current corresponding to a voltage Va(x) or Vb(x) of the voltage signal flows from the high-voltage power source to the low-voltage source through one resistive element 9 and the collector of one npn transistor 8 as a collector current for each npn transistor, a voltage on a transistor side of each resistive element 9 is lowered from the high voltage of the high-voltage power source to an amplified output voltage, and a differential amplified signal indicating a difference between the amplified output voltages is output to the differential signal amplifier 3(x+1). In this case, as an electric potential difference between the voltage signals input to the bases of the pair of npn transistors 8 is increased, the difference between the amplified output voltages generated by the resistive elements 9 is increased.

The detecting amplifier 4 fundamentally has the above differential amplification structure and has a pair of capacitive elements 10 respectively arranged in parallel to one resistive element 9. When a voltage signal of the differential amplified signal output from the differential signal amplifier 3(2) is input to the base of each npn transistor 8 of the detecting amplifier 4, a collector current corresponding to a voltage of the voltage signal flows through each npn transistor 8 almost in the same manner as the collector current in the differential signal amplifier 3(x), and an offset detecting output voltage Va(dec) or Vb(dec) on a transistor side of the resistive element 9 is determined according to the collector current for each npn transistor 8. Therefore, an offset detecting differential signal indicating a difference between the offset detecting output voltages Va(dec) and Vb(dec) is produced. The difference between the offset detecting output voltages depends on a base electric potential difference occurring between the voltage signals input to the bases of the pair of npn transistors 8 of the detecting amplifier 4.

Also, in cases where the base electric potential difference of the differential amplified signal input to the bases of the pair of npn transistors 8 changes, not only a portion of the collector current flows through each npn transistor 8, but also the other portion of the collector current is used to charge or discharge each capacitive element 10 in a voltage transitional state without passing through each resistive element 9. The voltage transitional state is continued by a prescribed time corresponding to a time constant determined by both the resistive element 9 and the capacitive element 10 of each low-pass filter 6. When the voltage transitional state is changed to a voltage stable state, the whole collector current passes through each resistive element 9, so that the offset detecting output voltages Va(dec) and Vb(dec) of the offset detecting differential signal become stable. In other words, in cases where the differential amplified signal input to the detecting amplifier 4 changes at time intervals shorter than a time corresponding to a response characteristic determined by the time constant, the offset detecting output voltages Va(dec) and vb(dec) of the offset detecting differential signal is still stable regardless of the changing of the differential amplified signal. Therefore, because the set of the resistive element 9 and the capacitive element 10 makes the offset detecting differential signal change in response to a slowly varying component (including a direct-current component) of the differential amplified signal input to the bases of the npn transistors 8 of the detecting amplifier 4, each set of the resistive element 9 and the capacitive element 10l functions as one low-pass filter 6. The low-pass filters 6 are integrally formed with the detecting amplifier 4 in the multi-stage signal amplifying circuit shown in FIG. 2.

The compensating current generating amplifier 5 is formed in the same differential amplification structure as that in the differential signal amplifier 3(x) because the resistive elements 9 of the differential signal amplifier 3(1) are used as resistive elements of the compensating current generating amplifier 5. Therefore, when the offset detecting differential signal output from the detecting amplifier 4 is input to bases of a pair of npn transistors 8 of the compensating current generating amplifier 5, collector currents denoting the offset compensating currents Icomp1 and Icomp2 are produced in the compensating current generating amplifier 5 in the same manner as in the differential signal amplifier 3(x). As a result, the collector current produced by one npn transistor 8 of the differential signal amplifier 3(1) and the collector current produced by one npn transistor 8 of the compensating current generating amplifier 5 flow through one resistive element 9 of the differential signal amplifier 3(1) for each resistive element, so that each of the voltages Va(1) and Vb(1) of the differential amplified signal output from the differential signal amplifier 3(1) is set according to the collector currents.

In the above configuration, an operation of the multi-stage signal amplifying circuit shown in FIG. 2 will be described.

Figure 6:
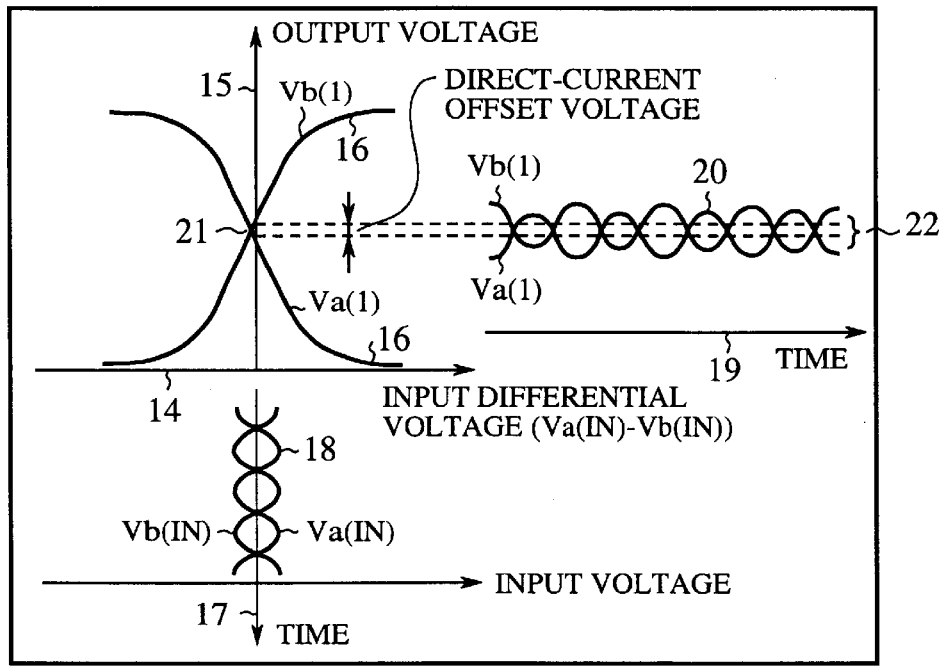
FIG. 6(*a*) is an input/output characteristic diagram of a differential signal amplifier of the first stage arranged in the conventional multi-stage signal amplifying circuit shown in FIG. 5.
Figure 6:
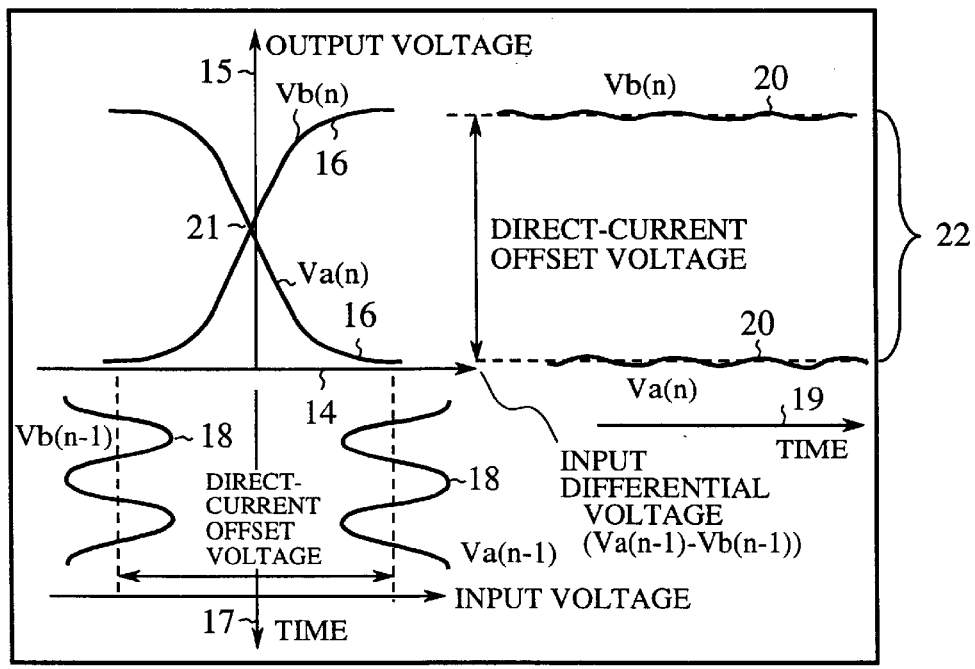

When a differential input signal is input to the pair of input terminals 1, the differential input signal is amplified in the differential signal amplifier 3(1) of the first stage to produce a differential amplified signal, the differential amplified signal is amplified in the differential signal amplifier 3(2) to produce a differential amplified signal, the differential amplified signal is amplified in the differential signal amplifier 3(3) to produce a differential amplified signal, the differential amplified signal is amplified in the differential signal amplifier 3(4) of the final stage to produce a differential output signal, and the differential output signal is output from the pair of output terminals 2. In this case, as referring to FIG. 6(a) and FIG. 6(b), a voltage relationship Va(1)<Vb(1), Va(2)>Vb(2), Va(3)<Vb(3) and Va(4)>Vb(4) is satisfied in case of Va(in)>Vb(in). In contrast, in case of Va(in)<Vb(in), a voltage relationship Va(1)>Vb(1), Va(2)<Vb(2), Va(3)>Vb(3) and Va(4)<Vb(4) is satisfied.

Also, the differential amplified signal produced in the differential signal amplifier 3(2) is input to the detecting amplifier 4 inevitably having a high input impedance, the differential amplified signal is amplified in the detecting amplifier 4, a direct-current component (including a slowly-varying component) existing in the differential amplified signal is extracted from the differential amplified signal in the low-pass filters 6 and is output to the compensating current generating amplifier 5 as an offset detecting differential signal composed of two detecting signals of voltages Va(dec) and Vb(dec). In this case, a voltage relationship Va(dec)<Vb(dec) is satisfied in cases where a direct-current voltage value of the voltage signal of Va(2) is higher than that of the voltage signal of Vb(2). In contrast, in cases where a direct-current voltage value of the voltage signal of Va(2) is lower than that of the voltage signal of Vb(2), a voltage relationship Va(dec)>Vb(dec) is satisfied.

When the offset detecting differential signal indicating the direct-current component of the differential amplified signal is input from the detecting amplifier 4 to the compensating current generating amplifier 5, the npn transistors 8 of the compensating current generating amplifier 5 make the offset compensating currents Icomp1 and Icomp2 flow through the resistive elements 9 of the differential signal amplifier 3(1). In this case, a voltage relationship Icomp1<Icomp2 is satisfied in case of Va(dec)<Vb(dec). In contrast, in case of Va(dec)>Vb(dec), a voltage relationship Icomp1>Icomp2 is satisfied.

Therefore, even though a direct-current voltage value of the voltage signal of Va(2) becomes higher than that of the voltage signal of Vb(2) because a direct-current offset occurs, for example, in the differential amplified signal output from the differential signal amplifier 3(1) to make a direct-current voltage value of the voltage signal of Va(1) become lower than that of the voltage signal of Vb(1), the offset compensating currents Icomp1 and Icomp2 satisfying the relationship Icomp1<Icomp2 flow through the resistive elements 9 of the differential signal amplifier 3(1) to lower the voltage Vb(1) by a voltage degree larger than that of the voltage Va(1). As a result, the differential amplified signal output from the differential signal amplifier 3(2) is finally compensated by the compensating current generating amplifier 5 to make the direct-current value of the voltage signal of Va(2) equal to that of the voltage signal of Vb(2).

Accordingly, even though the differential signal amplifier 3(1) is manufactured to originally generate a direct-current offset voltage component in the differential amplified signal output from the differential signal amplifier 3(1), because the differential amplified signal output from the differential signal amplifier 3(2) is compensated by the compensating current generating amplifier 5 to make the direct-current value of the voltage signal of Va(2) equal to that of the voltage signal of Vb(2), there is no case that the direct-current offset voltage component originally generated in the differential amplified signal, which is output from the differential signal amplifier 3(1), is undesirably amplified by the differential signal amplifier 3(3). That is, there is no case that the direct-current offset voltage component becomes near to an input dynamic range for a signal input to the differential signal amplifier 3(4) to make the differential amplified signal input to the differential signal amplifier 3(4) exceed the input dynamic range of the differential signal amplifier 3(4). Therefore, an alternating-current component indicating a signal component of the differential input signal can be correctly amplified in the differential signal amplifiers 3(1) to 3(4), and the differential output signal indicating the amplified alternating current component can be output from the output terminals 2.

Figure 7:
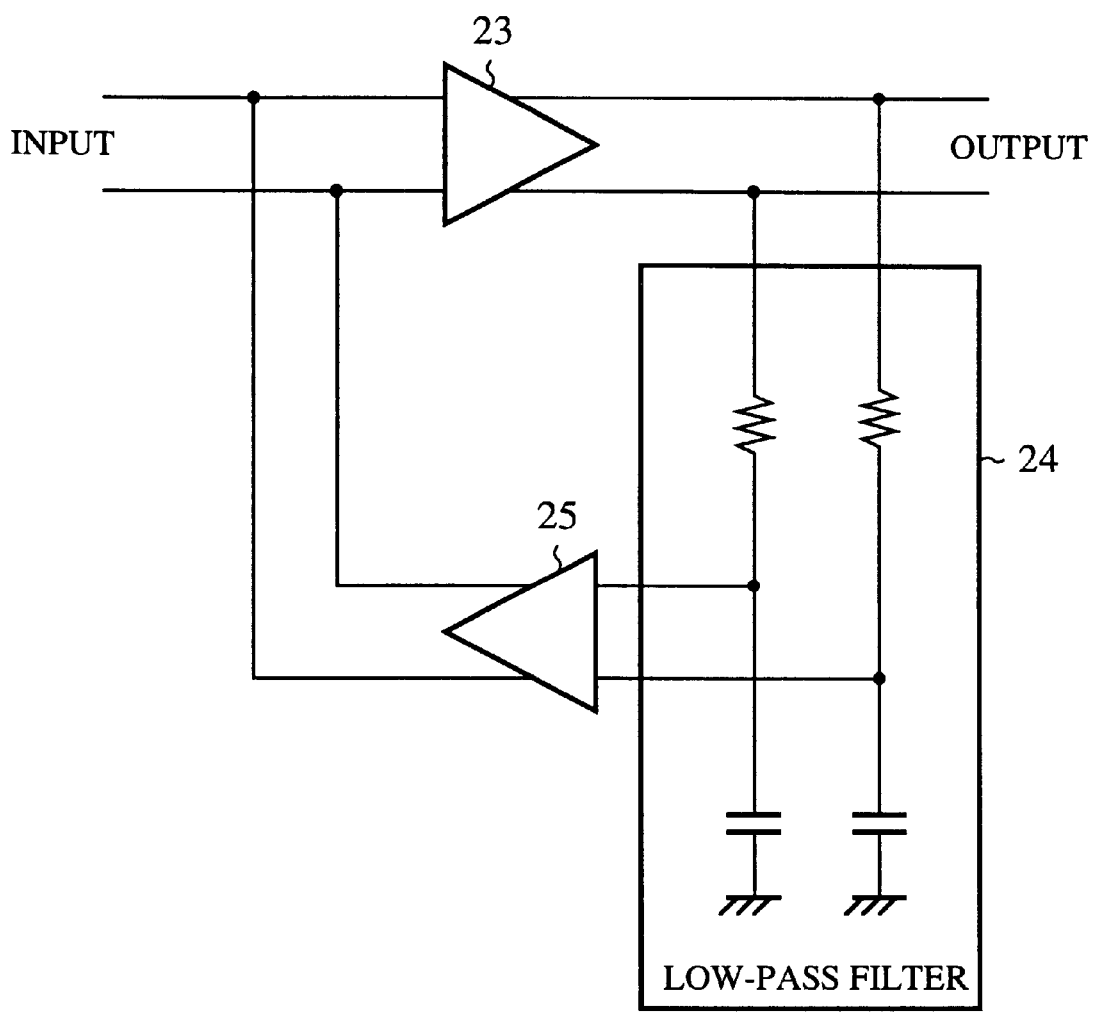
FIG. 7 is a circuit diagram showing the configuration of another conventional multi-stage signal amplifying circuit.

Also, in the detecting amplifier 4, because the differential amplified signal output from the differential signal amplifier 3(2) is received, at first, in the npn transistors 8 before the direct-current component of the differential amplified signal is extracted in the low-pass filters 6, an undesirable change of the differential amplified signal output from the differential signal amplifier 3(2) can be effectively suppressed because of a high input impedance of the npn transistors 8 of the detecting amplifier 4 inevitably provided. Therefore, in the conventional multi-stage signal amplifying circuit shown in FIG. 7, because the differential amplified signal is, at first, filtered in the low-pass filter 25 before the differential amplified signal is received in the direct-current offset compensating circuit 25, it is required that values of the resistive elements of the low-pass filter 25 are made high to obtain a high input impedance. However, in the first embodiment, because it is not required that values of the resistive elements 9 are made high to obtain a high input impedance, the resistive elements 9 and the capacitive elements 10 of the detecting amplifier 4 can be set to appropriate sizes (or values). Therefore, the resistive elements 9 and the capacitive elements 10 of the detecting amplifier 4 can be formed to occupy a minimized layout area on the semiconductor substrate, and the detecting amplifier 4 formed in the minimized layout area can have the same amplification characteristic as that of a conventional detecting amplifier.

Also, because the detecting amplifier 4 and the low-pass filters 6 use the pair of resistive elements 9 in common, the layout area occupied by the multi-stage signal amplifying circuit can be moreover reduced.

The suppression of the direct-current offset voltage component in this embodiment will be described in detail.

As shown in FIG. 1, a block amplification factor in a block from the differential signal amplifier 3(i) to the differential signal amplifier 3(n) is expressed by a sign A. Also, a feed-back gain of both the detecting amplifier 4 and the compensating current generating amplifier 5 is expressed by a sign B, a resistance value of each resistive element 9 of the differential signal amplifier 3(i−1) is expressed by a sign R, values of the collector currents flowing from the resistive elements 9 to the differential signal amplifier 3(i−1) in case of no offset compensation are expressed by signs I1 and I2, a differential voltage of the differential amplified signal output from the differential signal amplifier 3(n) is expressed by a sign Vout (Vout=Va(n)−Vb(n)), a direct-current offset voltage in a feed-back system from the detecting amplifier 4 to the compensating current generating amplifier 5 is expressed by a sign ΔV, a high voltage value at the high voltage power source is expressed by a sign Vcc, and a low voltage value at the low voltage source is set to 0 V. In this case, equations (1), (2) and (3) are satisfied.

$$Va(i-1) - Vb(i-1) = \{Vcc - R(I1 - Icomp1)\} - \{Vcc - R(I2 - Icomp2)\} \quad (1)$$
$$= R\{(I2 - I1) - (Icomp2 - Icomp1)\}$$

$$Vout = Va(n) - Vb(n) \quad (2)$$
$$= A\{Va(i-1) - Vb(i-1)\}$$

$$Icomp1 - Icomp2 = (B/R)(Vout + \Delta V) \quad (3)$$

An equation (4) is obtained from the equations (1), (2) and (3).

$$Vout = R(I1-I2)/(B-1/A) - \Delta V/\{1 - 1/(A*b)\} \quad (4)$$

Therefore, as is realized from the equation (4), because the first term of the equation (4) denotes the contribution of the direct-current component, which is included in the differential amplified signal output from the differential signal amplifier 3(i−1), on the differential voltage Vout, the contribution of the direct-current component on the differential voltage Vout is made small as the value of the feed-back gain B is increased. Therefore, the direct-current component of the differential amplified signal input to the differential signal amplifier 3(n+1) can be suppressed. Also, the second term of the equation (4) denotes a direct-current component derived from a direct-current offset in the feed-back system from the detecting amplifier 4 to the compensating current generating amplifier 5. Because the second term is not extraordinarily increased with the number of stages in the differential signal amplifiers, the second term does not approach the input dynamic range of the differential signal amplifier 3(n+1).

Accordingly, the direct-current offset occurring in the differential amplified signal output from one differential signal amplifier can be effectively suppressed in the multi-stage signal amplifying circuit according to the first embodiment.

In this embodiment, the differential amplified signal output from the differential signal amplifier 3(2) is input to the detecting amplifier 4. However, it is applicable that the differential amplified signal output from the differential signal amplifier 3(3) be input to the detecting amplifier 4. In this case, because a relationship Va(3)>Vb(3) (or Va(3)<Vb(3)) in the differential amplified signal, a relationship Vb(dec)>Va(dec) (or Vb(dec)<Va(dec)) in the offset detecting differential signal and a relationship Icomp2>Icomp1 in the compensating currents are satisfied in case of Va(1)>Vb(1) (or Va(1)<Vb(1)), it is required that a line of the compensating current Icomp1 in the compensating current generating amplifier 5 is connected with a line of the voltage signal of the voltage Vb(1) and a line of the compensating current Icomp2 in the compensating current generating amplifier 5 is connected with a line of the voltage signal of the voltage Va(1).

Embodiment 2

Figure 3:
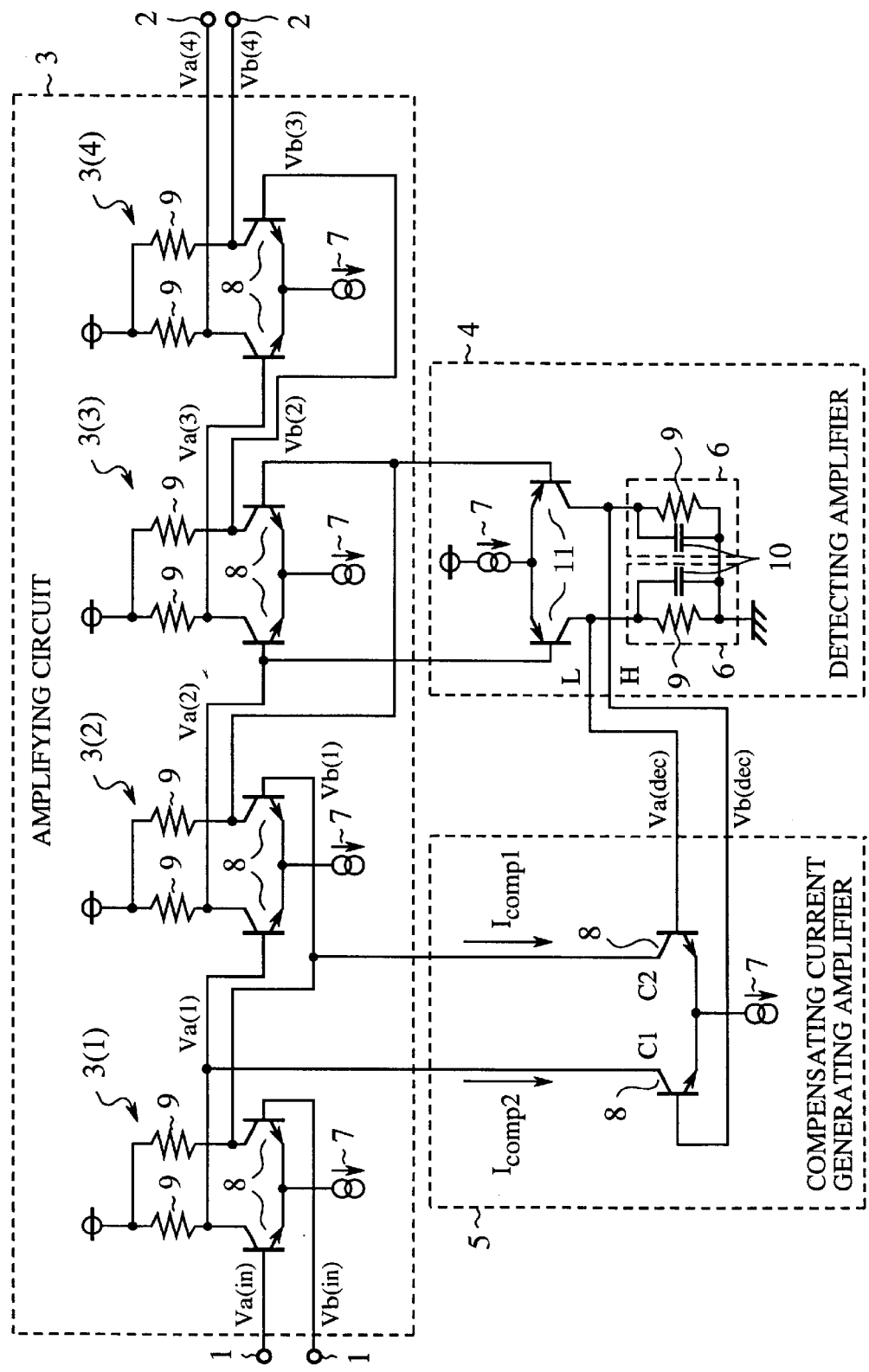
FIG. 3 is a circuit diagram showing a configuration example (at three stages) of the multi-stage signal amplifying circuit shown in FIG. 1 according to a second embodiment.

FIG. 3 is a circuit diagram showing a configuration example (n=3) of the multi-stage signal amplifying circuit shown in FIG. 1 according to a second embodiment.

In FIG. 3, a reference sign 11 indicates a positive-negative-positive (pnp) transistor. In the detecting amplifier 4, emitters of the pair of pnp transistors 11 are directly connected with each other, the constant current source 7 is arranged between a connection line of the emitters and a high-voltage power source (not shown), and the resistive element 9 is arranged between the collector of each pnp transistor 11 and a low-voltage source. Therefore, the detecting amplifier 4 fundamentally has a so-called differential amplification structure.

The differential amplified signal output from the differential signal amplifier 3(2) is input to the bases of the pnp transistors 11, an electric current corresponding to a voltage Va(2) or Vb(2) of the voltage signal flows from the constant current source 7 to the low-voltage source through the collector of one pnp transistor 11 and one resistive element 9 as a collector current for each pnp transistor, a voltage on a transistor side of each resistive element 9 is heightened to an offset detecting output voltage, and an offset detecting differential signal indicating a difference between the offset detecting output voltages is output to the compensating current generating amplifier 5. In this case, as an electric potential difference occurring between the amplified voltages applied to the bases of the pair of pnp transistors 11 is increased, the difference between the offset detecting output voltages generated by the resistive elements 9 is increased.

Also, the detecting amplifier 4 has a pair of capacitive elements 10 respectively arranged in parallel to one resistive element 9. Therefore, in the same manner as the detecting amplifier 4 in the first embodiment, two sets of the resistive element 9 and the capacitive element 10 functions as two low-pass filters 6 in which the offset detecting output voltages of the offset detecting differential signal are changed in response to only a slowly-varying component of the differential amplified signal input to the bases of the pair of pnp transistors 11. Therefore, the offset detecting output voltages of the offset detecting differential signal change with an electric potential difference between the voltages of the differential amplified signal input to the bases of the pair of pnp transistors 11 while being delayed by a time corresponding to a time constant determined by both the resistive element 9 and the capacitive element 10.

In the compensating current generating amplifier 5, a line of a compensating current Icomp1, which is connected with the pnp transistor 11 of the detecting amplifier 4 corresponding to the voltage signal of Va(2) output from the differential signal amplifier 3(2) in the same manner as in the first embodiment, is connected with a line corresponding to the voltage signal of Vb(1) output from differential signal amplifier 3(1). Also, a line of a compensating current Icomp2, which is connected with the pnp transistor 11 of the detecting amplifier 4 corresponding to the voltage signal of Vb(2) output from the differential signal amplifier 3(2) in the same manner as in the first embodiment, is connected with a line corresponding to the voltage signal of Va(1) output from differential signal amplifier 3(1).

The other configuration of the multi-stage signal amplifying circuit shown in FIG. 3 is the same as that shown in FIG. 2. Therefore, the description of the other configuration is omitted.

In the above configuration, an operation of the multi-stage signal amplifying circuit shown in FIG. 3 will be described.

When the differential amplified signal output from the differential signal amplifier 3(2) is input to the detecting amplifier 4, a direct-current component (including a slowly-varying component) of the differential amplified signal is amplified and extracted, and the direct-current component (including the slowly-varying component) is output to the compensating current generating amplifier 5. In this case, a voltage relationship Va(dec)>Vb(dec) is satisfied in cases where a direct-current voltage value of the voltage signal of Va(2) is higher than that of the voltage signal of Vb(2) (a relationship Va(2)>Vb(2) in the direct-current voltage value). In contrast, in case of a direct-current voltage value of the voltage signal of Va(2) is lower than that of the voltage signal of Vb(2) (a relationship Va(2)<Vb(2) in the direct-current voltage value), a voltage relationship Va(dec)<Vb (dec) is satisfied.

Therefore, in cases where an electric potential difference satisfying the relationship Va(2)>Vb(2) in the direct-current voltage value is generated in the differential amplified signal output from the differential signal amplifier 3(2) because a direct-current offset occurs, for example, in the differential signal amplifier 3(1) to satisfy the relationship Va(1)<Vb(1) in the direct-current voltage value, offset compensating currents Icomp1 and Icomp2 satisfying the relationship Icomp1>Icomp2 flow through the resistive elements 9 of the differential signal amplifier 3(1) to lower the voltage Vb(1) by a voltage degree larger than that of the voltage Va(1). As a result, the differential amplified signal output from the differential signal amplifier 3(2) is finally compensated by the compensating current generating amplifier 5 to make the direct-current voltage value of the voltage signal of Va(2) equal to that of the voltage signal of Vb(2).

The other operation of the multi-stage signal amplifying circuit according to the second embodiment is the same as that according to the first embodiment. Therefore, the description of the other operation is omitted.

Accordingly, in the same manner as in the first embodiment, even though the differential signal amplifier 3(1) is manufactured to originally generate the direct-current offset voltage component in the differential amplified signal output from the differential signal amplifier 3(1), because the differential amplified signal output from the differential signal amplifier 3(2) is compensated by the compensating current generating amplifier 5 to make the voltage value of the direct-current voltage value of the voltage signal of Va(2) equal to that of the voltage signal of Vb(2), there is no case that the voltage of the differential amplified signal output from the differential signal amplifier 3(3) exceeds an input dynamic range of the differential signal amplifier 3(4). Therefore, an alternating current component indicating a signal component of the differential input signal can be correctly amplified in the differential signal amplifiers 3(1) to 3(4), and the differential output signal indicating the amplified alternating current component can be output from the output terminals 2.

Also, in the same manner as in the first embodiment, it is not required that values of the resistive elements 9 are made high to obtain a high input impedance, the resistive elements 9 and the capacitive elements 10 of the detecting amplifier 4 can be formed at appropriate sizes (or values). Therefore, the detecting amplifier 4 formed in the minimized layout area can have the same amplification characteristic as that of a conventional detecting amplifier.

Also, the pair of pnp transistors 11 are used for the detecting amplifier 4. Because frequency characteristics of a pnp transistor formed on a semiconductor substrate are generally inferior to those of an npn transistor formed on the semiconductor substrate (for example, a high-frequency follow-up characteristic in the pnp transistor is low), a function of a low-pass filter can be obtained in the differential amplification structure of the pair of pnp transistors 11 without the low-pass filters 6. Therefore, a size of each low-pass filter 6 composed of the resistive element 9 and the capacitive element 10 can be made small, so that the size of the detecting amplification 4 can be formed in a layout area smaller than that in the first embodiment.

Embodiment 3

Figure 4:
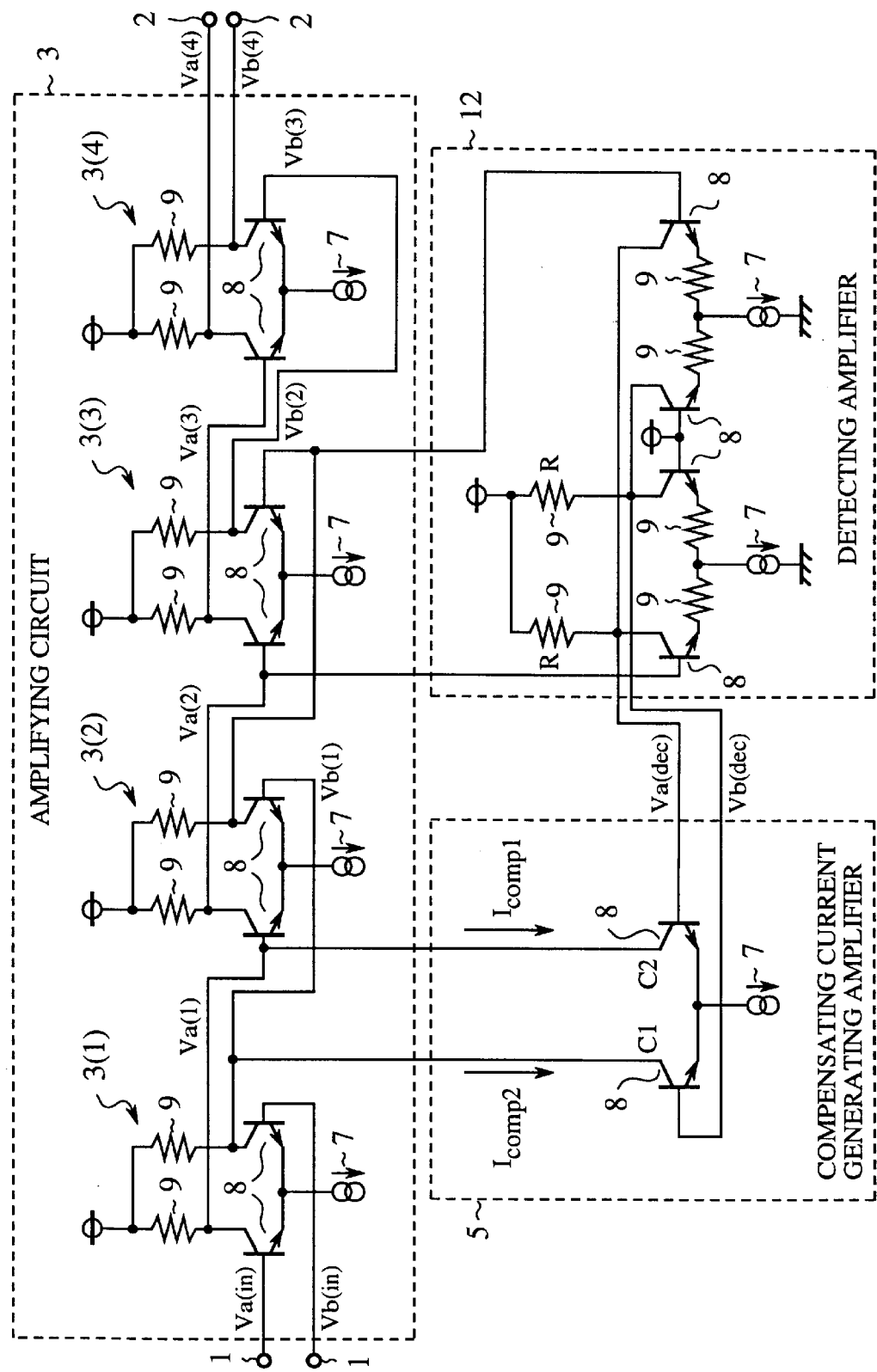
FIG. 4 is a circuit diagram showing a configuration example (at three stages) of the multi-stage signal amplifying circuit according to a third embodiment.
Figure 5:
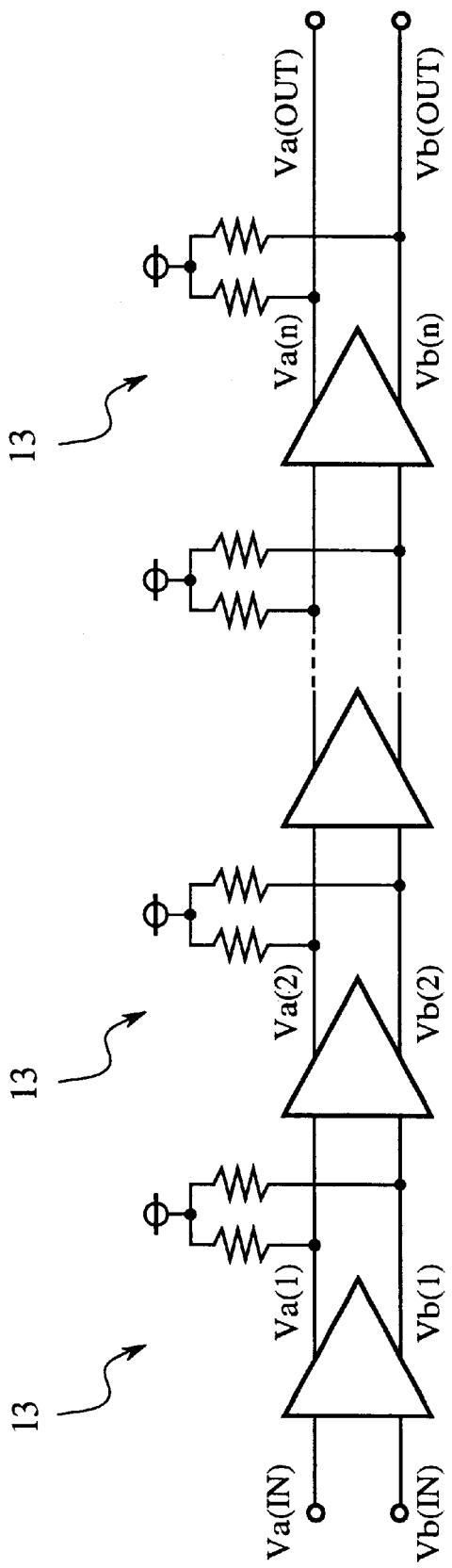
FIG. 5 is a circuit diagram showing the configuration of a conventional multi-stage signal amplifying circuit.

FIG. 4 is a circuit diagram showing a configuration example (n=3) of the multi-stage signal amplifying circuit according to a third embodiment.

In FIG. 4, a reference sign 12 indicates a detecting amplifier. In the detecting amplifier 12, collectors of two npn transistors 8 selected from two pairs of npn transistors 8 are connected with one resistive element 9, collectors of the other two npn transistors 8 selected from two pairs of npn transistors 8 are connected with the other resistive element 9, bases of the two npn transistors 8, of which the collectors are connected with one resistive element 9, are connected with a high-voltage power source in common, each of two emitters of one pair of npn transistors 8 is connected with a common constant current source 7 through a resistive element 9, the common constant current source 7 is connected with a low-voltage source, each of two emitters of the other pair of npn transistors 8 is connected with another common constant current source 7 through a resistive element 9, the common constant current source 7 is connected with a low-voltage source, and the four collectors of two pairs of npn transistors 8 are connected with a common high-voltage power source through the resistive elements 9. Also, the differential amplified signal output from the differential signal amplifier 3(2) is input to the two bases of the two npn transistors 8 of which the collectors are connected with the other resistive element 9.

In the above configuration, the suppression of an alternating current component included in the differential amplified signal output from the differential signal amplifier 3(2) will be described.

Each of the npn transistors 8 has a linear amplification characteristic at an amplification factor K. A constant current of a value Iee passes through each constant current source 7. A first voltage signal of the differential amplified signal output from the differential signal amplifier 3(2) is formed by superposing an alternating-current component of a value Vac on a direct-current component of a value Vdc, and a second voltage signal of the differential amplified signal output from the differential signal amplifier 3(2) is formed of only an alternating-current component of a value -Vac.

In this case, a collector current passing through a first npn transistor 8, to which the first voltage signal of the differential amplified signal is applied, is expressed according to an equation (5).

$$I1 = k(Vdc+Vac) + Iee/2 \tag{5}$$

Also, a collector current passing through the transistor 8, which is arranged with the first npn transistor 8 in a pair, is expressed according to an equation (6).

$$I2 = -k(Vdc+Vac) + Iee/2 \tag{6}$$

Also, a collector current passing through a second npn transistor 8, to which the second voltage signal of the differential amplified signal is applied, is expressed according to an equation (7).

$$I3 = k*(-Vac) + Iee/2 \tag{7}$$

Also, a collector current passing through the transistor 8, which is arranged with the second npn transistor 8 in a pair, is expressed according to an equation (8).

$$I4 = -k*(-Vac) + Iee/2 \tag{8}$$

Also, a current passing through the resistive element 9, which is connected with the collectors of the first and second npn transistors 8, is expressed according to an equation (9).

$$\begin{aligned} I5 &= I1 + I3 \\ &= k*(Vdc) + Iee \end{aligned} \tag{9}$$

Also, a current passing through the resistive element 9, which is connected with the collectors of the transistors 8 other than the first and second npn transistors 8, is expressed according to an equation (10).

$$\begin{aligned} I6 &= I2 + I4 \\ &= -k*(Vdc) + Iee \end{aligned} \tag{10}$$

Therefore, the alternating-current component existing in the differential amplified signal output from the differential signal amplifier 3(2) is cancelled out in an offset detecting difference signal output from the detecting amplifier 12, and the offset detecting difference signal based on only the direct-current component is output from the detecting amplifier 12 to the compensating current generating amplifier 5.

In this case, a voltage on a transistor side of the resistive element 9 connected with the collectors of the first and second npn transistors 8 is output as a detecting signal of a voltage Va(dec), and a voltage on a transistor side of the resistive element 9 connected with the collectors of the transistors 8 other than the first and second npn transistors 8 is output as a detecting signal of a voltage Vb(dec). Therefore, even though a direct-current voltage value of the voltage signal of Va(2) becomes higher than that of the voltage signal of Vb(2) by the direct-current component of the value Vdc because a direct-current offset voltage component occurs, for example, in the differential amplified signal output from the differential signal amplifier 3(1) to make a direct-current voltage value of the voltage signal of Va(1) become lower than that of the voltage signal of Vb(1), the offset detecting difference signal satisfying the relationship Va(dec)<Vb(dec) is output to the compensating current generating amplifier 5, the offset compensating currents Icomp1 and Icomp2 satisfying the relationship Icomp1<Icomp2 flow through the resistive elements 9 of the differential signal amplifier 3(1) to lower the voltage Vb(1) by a voltage degree larger than that of the voltage Va(1). As a result, the differential amplified signal output from the differential signal amplifier 3(2) is finally compensated by the compensating current generating amplifier 5 to make the direct-current value of the voltage signal of Va(2) equal to that of the voltage signal of Vb(2).

In this embodiment, all the npn transistors 8 of the detecting amplifier 12 have the linear amplification characteristic (the amplification factor K). However, even though each of the npn transistors 8 has a non-linear amplification characteristic, the alternating-current component existing in the differential amplified signal is cancelled out in the offset detecting difference signal.

Also, in this embodiment, the two pairs of npn transistors 8 are used for the detecting amplifier 12. However, it is applicable that two pairs of pnp transistors 11 be used for the detecting amplifier 12. In this case, the four collectors of two pairs of pnp transistors 11 are connected with a common low-voltage source through the resistive elements 9, bases of the two pnp transistors 11, of which the collectors are connected with one resistive element 9, are connected with a low-voltage power source in common, and the constant current source 7 arranged on the emitter side of each pair of pnp transistors 11 is connected with a high-voltage power source.

Accordingly, in the same manner as in the first embodiment, even though the differential signal amplifier 3(1) is manufactured to originally generate the direct-current offset voltage component in the differential amplified signal output from the differential signal amplifier 3(1), because the differential amplified signal output from the differential signal amplifier 3(2) is compensated by the compensating current generating amplifier 5 to make the voltage value of the direct-current voltage value of the voltage signal of Va(2) equal to that of the voltage signal of Vb(2), there is no case that the voltage of the differential amplified signal output from the differential signal amplifier 3(3) exceeds an input dynamic range of the differential signal amplifier 3(4). Therefore, an alternating current component indicating a signal component of the differential input signal can be correctly amplified in the differential signal amplifiers 3(1) to 3(4).

Also, in the same manner as in the first embodiment, it is not required that values of the resistive elements 9 of the detecting amplifier 12 are made high to obtain a high input impedance, the resistive elements 9 of the detecting amplifier 4 can be formed at appropriate sizes (or values). Therefore, the detecting amplifier 4 formed in the minimized layout area can have the same amplification characteristic as that of a conventional detecting amplifier.

Also, in this embodiment, the offset detecting differential signal, in which the alternating-current component existing in the differential amplified signal is cancelled out, is output from the detecting amplifier 4 without using any capacitive element in the detecting amplifier 4. Also, because no capacitive element is used in the detecting amplifier 12, it is not required to consider a time constant, so that the values of the resistive elements 9 can be made small. Therefore, the multi-stage signal amplifying circuit including the detecting amplifier 4 can be manufactured in a prescribed layout area smaller than that of the multi-stage signal amplifying circuit according to the first embodiment.

What is claimed is:

1. A multi-stage signal amplifying circuit in which a plurality of differential signal amplifiers are serially arranged in multi-stage to receive an output of one differential signal amplifier in another differential signal amplifier, to differentially amplifying a differential input signal input to the differential signal amplifier of a first stage and to output a differential output signal from the differential signal amplifier of a final stage, comprising:

a detecting amplifier for receiving a differential amplified signal output from a particular differential signal amplifier placed on a second stage or after the second stage and differentially amplifying the differential amplified signal to output an offset detecting differential signal;

a low-pass filter for passing only a direct-current component of the offset detecting differential signal output from the detecting amplifier; and a compensating current generating amplifier for receiving the offset detecting differential signal passing through the low-pass filter, producing an offset compensation differential signal according to the offset detecting differential signal and inputting the offset compensation differential signal to a specific differential signal amplifier preceding to the particular differential signal amplifier.

2. A multi-stage signal amplifying circuit according to claim 1, wherein the detecting amplifier comprises a pair of npn transistors of which emitters are connected with each other;

a constant current source arranged between the group of emitters of the npn transistors and a low-voltage source;

a resistive element arranged between the collector of one npn transistor and a high-voltage power source; and another resistive element arranged between the collector of the other npn transistor and the high-voltage power source, and the low-pass filter comprises the pair of resistive elements;

a capacitive element arranged in parallel to one resistive element; and another capacitive element arranged in parallel to the other resistive element.

3. A multi-stage signal amplifying circuit according to claim 1, wherein the detecting amplifier comprises a pair of pnp transistors of which emitters are connected with each other;

a constant current source arranged between the group of emitters of the pnp transistors and a high-voltage power source;

a resistive element arranged between the collector of one pnp transistor and a low-voltage source; and another resistive element arranged between the collector of the other pnp transistor and the low-voltage source, and the low-pass filter comprises the pair of resistive elements;

a capacitive element arranged in parallel to one resistive element; and another capacitive element arranged in parallel to the other resistive element.

4. A multi-stage signal amplifying circuit in which a plurality of differential signal amplifiers are serially arranged in multi-stage to receive an output of one differential signal amplifier in another differential signal amplifier, to differentially amplifying a differential input signal input to the differential signal amplifier of a first stage and to output a differential output signal from the differential signal amplifier of a final stage, comprising:

a detecting amplifier, in which a first pair of transistors, a second pair of transistors, a resistive element connected with both a collector of a first transistor of the first pair of transistors and a collector of a first transistor of the second pair of transistors, a resistive element connected with both a collector of a second transistor of the first pair of transistors and a collector of a second transistor of the second pair of transistors, a resistive element connected with an emitter of one transistor for each of the four transistors, a constant current source arranged between the group of resistive elements connected with the emitters of the first pair of transistors and a high-voltage power source or a low-voltage source and a constant current source arranged between the group of resistive elements connected with the emitters of the second pair of transistors and the high-voltage power source or the low-voltage source are arranged and bases of the second transistors of the pairs of transistors are connected with another low-voltage source or another high-voltage power source, for receiving a differential amplified signal output from a particular differential signal amplifier placed on a second stage or after the second stage at bases of the first transistors of the pairs of transistors and differentially amplifying the differential amplified signal to output an offset detecting differential signal; and a compensating current generating amplifier for receiving the offset detecting differential signal output from the detecting amplifier, producing an offset compensation differential signal according to the offset detecting differential signal and inputting the offset compensation differential signal to a specific differential signal amplifier preceding to the particular differential signal amplifier.

* * * * *